United States Patent [19]

Colineau

[11] Patent Number: 4,473,007
[45] Date of Patent: Sep. 25, 1984

[54] APPARATUS FOR POSITIONING AND HOLDING A SCREEN CARRIER IN A SERIGRAPHIC MACHINE

[75] Inventor: Robert C. Colineau, Angers, France

[73] Assignee: Compagnie Internationale Pour L'Informatique Cii-Honeywell Bull (Societe Anonyme), Paris, France

[21] Appl. No.: 331,282

[22] Filed: Dec. 16, 1981

[30] Foreign Application Priority Data

Dec. 24, 1980 [FR] France ................................ 80 27418

[51] Int. Cl.³ ........................ B41F 27/04; B05C 17/08
[52] U.S. Cl. ................................ 101/127.1; 101/383; 101/DIG. 12
[58] Field of Search ............... 101/114, 116, 117, 118, 101/119, 120, 123, 124, 126, 127, 127.1, 128, 128.1, 370, 372, 373, 381, 382 R, 383, 384

[56] References Cited

U.S. PATENT DOCUMENTS

| | | | |
|---|---|---|---|
| 471,432 | 3/1892 | Reid | 101/384 |
| 551,037 | 12/1895 | Marshall | 101/384 |
| 898,196 | 9/1908 | Doolittle | 101/384 |
| 1,038,868 | 9/1912 | Gammeter | 101/370 |
| 1,088,410 | 2/1914 | Gammeter | 101/370 |
| 1,088,670 | 2/1914 | Allen | 101/370 |
| 1,122,839 | 12/1914 | Allen | 101/370 |
| 1,811,167 | 6/1931 | Anderson | 101/123 |
| 3,890,899 | 6/1975 | Brugge | 101/384 |
| 4,005,651 | 2/1977 | Sigel | 101/128.1 |
| 4,148,604 | 4/1979 | Bachtiger | 101/114 |

FOREIGN PATENT DOCUMENTS 1208614  10/1970  United Kingdom ................ 101/126

OTHER PUBLICATIONS

Baker; IBM Tech. Disc. Bul.; vol. 18, No. 3, 8/75, pp. 811, 812.
Formichelli; IBM Tech. Disc. Bul.; vol. 15, No. 4, 9/72, p. 1072.
Morgan; Xerox Disc. Jour.; vol. 4, No. 2; 3/4/79, p. 237.

Primary Examiner—Clyde I. Coughenour
Attorney, Agent, or Firm—Kerkam, Stowell, Kondracki & Clarke

[57] ABSTRACT

The invention relates to apparatus for positioning and holding a screen carrier in a serigraphic machine. The positioning and holding apparatus is essentially constituted by two parallel grooves (21, 22) machined in the screen carrier (10) and cooperating stops and a side latch mechanism on the machine. The two grooves have at least one extremity opening on the same edge (C1) of the screen carrier. In these two grooves (21, 22) are respectively mounted the two stops (23, 24) which are designed to come respectively into contact with two fixed reference pins carried by the serigraphic machine. During insertion of the screen carrier, by sliding in its plane along two sides of the serigraphic machine, the two reference pins ride in the respective slots contacting the stops when the screen carrier is inserted fully. A latch locking arrangement is provided on the machine or maintaining and holding the screen carrier in position once the reference pins are in contact with the associated stops. Additional bores may be provided in the screen carrier on the axis of the grooves to cooperate with further reference pins and an articulated holding lever for assuring adjustment of the pattern of the screen with respect to the screen carrier before mounting of the screen carrier in the serigraphic machine. The invention applies notably to the manufacture of substrates of integrated circuits.

9 Claims, 8 Drawing Figures

APPARATUS FOR POSITIONING AND HOLDING A SCREEN CARRIER IN A SERIGRAPHIC MACHINE

BACKGROUND OF THE INVENTION

1. Field of the Invention

The present invention relates generally to a serigraphic machine and more particularly to apparatus for positioning and holding a screen carrier in a serigraphic machine adapted primarily for the manufacture of integrated circuits and substrates therefor.

2. Description of the Prior Art

To obtain circuits which are more and more efficient and to assemble them in a reduced volume, that is to say, to make them more compact, manufacturers have been led to utilize microplates for integrated circuits commonly known as chips and to mount them on the substrates in which the conductors are distributed in several separate planes separated one from the other by insulating layers, except for certain predetermined points where conductive columns assure electric connection between the conductors situated in the different planes.

The manufacture of each substrate is generally done with a serigraphic machine which provides for depositing on an electrically insulating support, which may be, for example, alumina, a series of alternating conductive and insulating layers, each layer being obtained by application of, through a screen of which the transparent portion corresponds to that of the layer to be obtained, the pasty material which is either conductive or insulating. After each application of a layer, this support is withdrawn from the serigraphic machine and placed in a furnace maintained at a high termperature. This heating step permits the layer to solidify and form a layer having a metallic or insulating character which adheres strongly to the base support or to the preceding layer.

In order to obtain proper electric connections between the conductors situated in the different planes, it is indispensable not only to have the screens (which are mounted successively in the serigraphic machine for deposit of the layers) positioned with very great precision one with respect to the others, but to equally insure that each time the support is put in place in the serigraphic machine to receive a layer, it is positioned with precision with respect to the screen.

The screen is generally carried by a support which is positioned and maintained in position in the serigraphic machine by a positioning and holding device. Such a device is described in French Application No. 80.27417 filed in France on Dec. 24, 1980 in the name of Compagnie Internationale Pour L'Informatique Cii-Honeywell Bull, assignee of the present invention, and corresponding application for patent in the United States, Ser. No. 331,283, filed concurrently herewith. The subject matter of said application is hereby incorporated by reference. The device described in this application comprises two parts respectively carried by the screen carrier and by the serigraphic machine. At the level of the screen carrier the device comprises two bores, and at the level of the serigraphic machine it comprises two brooches or reference pins with vertical axes adapted to engage in the two bores of the screen carrier to assure the positioning of the screen carrier while the holding in position of the screen carrier is carried out by simple blocking screws.

However, it is important to note that the mounting of the screen carrier in the serigraphic machine is carried out by displacement of the screen carrier in a direction perpendicular to its plane to bring it from a lower position to an upper position where the fixed reference pins, with vertical axis, enter in the corresponding bores of the screen carrier. In such a serigraphic machine, the screen support is placed on a movable table movable along a vertical axis and displacement of the table is controlled by a jack. The screen carrier is put in place by immovable vertical columns which provide only approximate centering of the screen support.

The final positioning of the screen support in the serigraphic machine is obtained by the precision of manufacture of the reference pins and of the bores, machining carried out to about several microns. In other words, the precision of positioning of the screen carrier can be obtained only under the condition that it has minimum play between each reference pin and the corresponding bore of the screen carrier. Because of the imprecision of the mounting of the screen carrier, the repeated cooperation between the reference pins and the bores of the screen carrier causes a progressive and inevitable wear of these parts. As a result of this wear, the necessary precision of positioning of the screen carrier in the serigraphic machine is eventually lost. Finally, it is to be noted that the mounting of the screen carrier requires the use of mounting columns which encumbers the structure of the serigraphic machine.

SUMMARY OF THE INVENTION

The present invention reduces wear caused by repetitive cooperation between the reference pins and the bores of the screen carrier in a serigraphic machine and eliminates the use of support columns for putting the screen carrier in place in the serigraphic machine.

To this end, the invention provides a positioning and holding device for the screen carrier in a serigraphic machine adapted for the manufacture of supports for integrated circuits having multiple thick layers. The screen carrier is in the form of a body with four sides defined by four principal connecting frame members and defining between them an opening on the two principal opposed faces of the screen carrier. At least two members are parallel to each other, and each of these two posts have at least two plane opposed surfaces situated respectively at the level of the two principal faces of the screen carrier. A screen may thus be supported on a face of the screen carrier and cover its opening. The invention is particularly characterized in that the positioning and holding device for the screen carrier comprises: two grooves, with parallel axes, machined respectively in two of the plane surfaces of the two parallel members of the screen carrier and extending parallel to these two members. These two grooves have at least an extremity opening toward the exterior of a same side of a screen carrier or front side. Two stops are mounted respectively in the two grooves, and two horizontal slides with parallel axes are carried by the base of the serigraphic machine and cooperate respectively with two of the plane surfaces of the parallel posts of the screen carrier, during the introduction by sliding of the screen carrier in the serigraphic machine. Two reference pins with vertical axes, and fixed solidly with the base of the machine, are aligned respectively with the axes of the two grooves of the screen carrier and sized in such a way as to freely penetrate in these grooves before coming respectively in contact with the two stops mounted in these grooves. Means for maintaining and holding the screen carrier in position once the reference pins are in contact with the associated stops of the screen carrier are also provided.

In accordance with another characteristic of the invention, the extremity of contact of one of the two stops with the associated reference pin is straight, while the surface of extremity of contact of the other stop with the associated reference pin has a curve having a section in V in which curve the associated reference pin is positioned.

In accordance with another characteristic of the invention, one of the two stops is situated toward the front side of the screen carrier while the other is situated toward the opposite side of the screen carrier or back side.

In accordance with another characteristic of the invention, the two grooves are situated at the level of the same principal face of the screen carrier, primarily at the level of the face of the screen carrier opposed to that receiving the screen.

In accordance with still another characteristic of the invention, the means for maintaining and holding the screen carrier in position, once the reference pins are in contact with the associated stops, are constituted by a movable catch in a plane perpendicular to the back side of the screen carrier. The catch is connected to an axle rotated by a jack of which the body is supported by the base of the machine. The catch, after rotation, exerts a contact pressure on the rear side of the screen carrier.

Thus, with such a positioning and holding device, the screen carriers mounted successively in the serigraphic machine are positioned with very great precision, one with respect to the others, but this does not necessarily provide a precise positioning of the pattern carried by the screen with respect to the screen area, which precision is indispensable for the obtaining of multilayer circuits.

Generally, the screen is provided with a photosensitive resin which is partially removed to eliminate the resin in certain areas to form a transparent pattern to be printed. A device which permits adjustment or regulation of the position of the pattern of the screen with respect to the screen carrier, before mounting in the serigraphic machine, is described in U.S. Pat. No. 4,005,651 of the applicant. Understandably, before making the final adjustment, it is necessary to position and maintain in position the screen carrier on a support. This support integrated with the adjusting device for the position of the pattern of the screen with respect to the screen carrier, comprises two fixed reference pins, with vertical axis, which engage in the two bores of the screen carrier.

In accordance with the present invention, the device for positioning and holding the screen carrier in the serigraphic machine does not utilize bores at the level of the screen carrier. Under these conditions, the screen carrier cannot cooperate with a regulating device as hereinafter identified before mounting in the serigraphic machine.

The mounting of the screen carrier in accordance with the positioning and holding device conforming to the invention at the level of the serigraphic machine is carried out in displacing the screen carrier in a horizontal plane so that its mounting on the support of the regulating device aforesaid is carried out in the displacement following a vertical direction perpendicular to the plane of the screen carrier.

However, it is possible to complete the structure of the positioning and holding device conforming to the invention to render it compatible with that of the regulating device aforesaid.

Thus, in accordance with another characteristic of the invention, the positioning and holding device, to assure the adjustment of the position of the pattern of the screen with respect to the screen carrier before its mounting in the serigraphic machine, comprises two bores traversing one side to the other of the screen carrier. The bores are centered respectively on the axes of two grooves, situated respectively in the neighborhood of two stops lodged respectively in the two grooves in such a way that the extreme surfaces of the stops adjacent to the front side of the screen carrier respectively enter in these two orifices which receive respectively the two reference pins, with vertical axis, carried by a support or base of an adjusting device for the position of the screen with respect to the screen carrier. The diameters of the orifices are greater than the diameter of the reference pins. Means for blocking the screen carrier against the reference pins are constituted by an articulated lever situated in the plane of the screen carrier and is movable under the action of a control jack to displace the screen carrier in a movement of translation.

BRIEF DESCRIPTION OF THE DRAWINGS

Other advantages, characteristics and details will appear from the description which follows made in reference to the accompanying drawings in which.

DESCRIPTION OF THE PREFERRED EMBODIMENTS

Before describing the positioning and holding device of a screen carrier conforming to the invention, it is advantageous to define initially the general structure of a screen carrier 10 adapted to be introduced in a serigraphic machine for the manufacture of integrated circuits in the form of multiple thick conductive and insulative layers deposited on a support base.

Referring to FIGS. 1 to 4, the screen carrier 10 has the form of a body with four principal sides C1, C2, C3, C4 defining between them an opening 11 which opens on the two opposed principal faces F1 and F2 which form the top and bottom, respectively, of screen carrier 10. The four sides of screen carrier 10 are, for example, defined by four sections or posts, connecting frame members 1, 2, 3, 4, respectively. The four posts members 1,2,3 and 4 are interconnected to form an integral framework having central opening 11.

Figure 2:
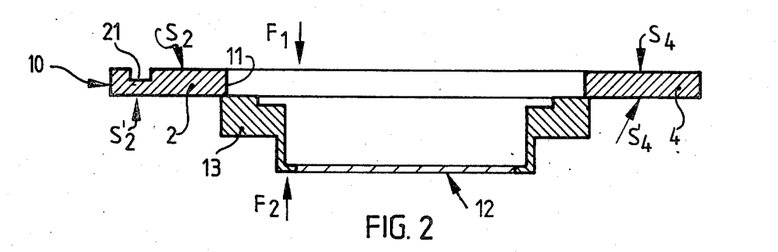
FIG. 2 is a view in section on the line II—II of FIG. 1 with the screen mounted on the screen carrier.
Figure 3:
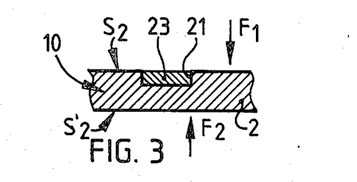
FIG. 3 is an enlarged partial sectional view on the line III—III of FIG. 1.

To enter in the body of the invention, it is necessary that screen carrier 10 has a structure having the two following characteristics:

two of its sides, for example, the side C2 and C4, should be parallel to each other; and each of the two members 2, 4 defining these two sides C2, C4 should have two plane surfaces which are opposed and extend the length of the associated post of screen carrier 10. These plane surfaces should be situated respectively at the level of the two principal opposed faces F1 and F2 of the screen carrier 10. As shown in FIG. 2, the surfaces S2, S'2 for the members 2 and S4, S'4 for the members 4, illustrate this arrangement.

Referring more particularly to FIG. 2, the screen carrier 10 such as that defined above is designed to support a screen 12 on which is provided a pattern to be imprinted (not shown). This screen 12 is, for example, carried by a body 13 which is itself supported on one of the principal faces F1 of F2 of screen carrier 10, F2 in the example illustrated in FIG. 2. Body 13 is fixed and positioned on carrier 10 in such a way that the screen 12 overlaps opening 11 of screen carrier 10. That is to say, the screen and opening are coaxially arranged. Preferably, body 13 is a part of the structure of screen carrier 10 and can be considered to be integral therewith.

The positioning and holding apparatus or device conforming to the invention divides in two parts 20a, 20b situated respectively at the level of the screen carrier 10 and at the level of the serigraphic machine.

Referring to FIGS. 1 to 4, part 20a of the positioning and holding device of the screen carrier 10 is essentially constituted by two grooves 21, 22 and two stops 23, 24 respectively lodged in the two grooves 21, 22.

Figure 1:
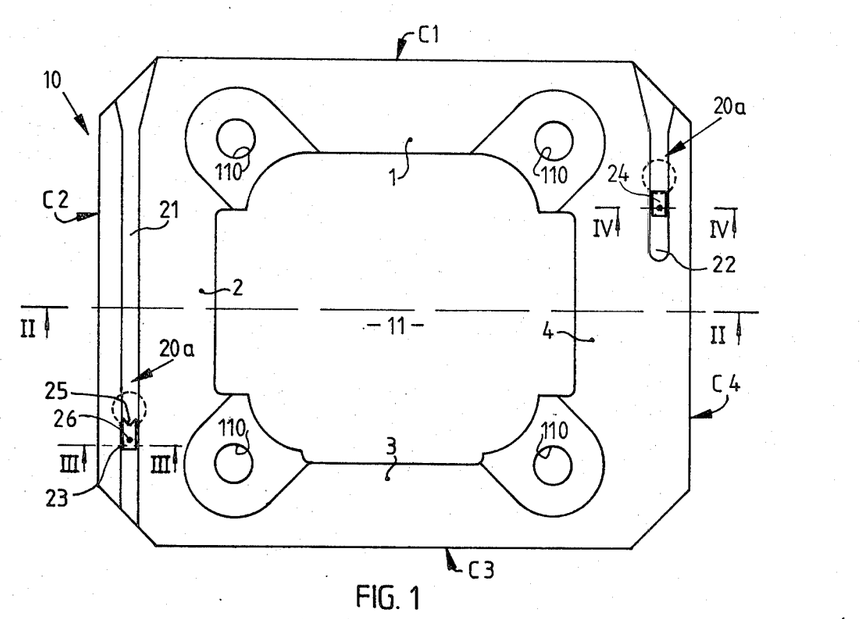
FIG. 1 is a plan view of a screen carrier to illustrate the part of the positioning device and locking device conforming to the invention situated at the level of the screen carrier.

The two grooves 21, 22 are straight with parallel axes machines respectively in the two plane surfaces S1 and S4 of the two posts 2, 4 defining the two sides C2 and C4 of screen carrier 10. These two grooves 21, 22 extend parallel to the sides C2 and C4 and have each at least one extremity which opens toward the exterior of a same side of the screen carrier 10. In the example shown, the two grooves 21, 22 open on side C1 of screen carrier 10, which side shall hereafter be referred to as the front side, while the opposite side C3 will be hereafter referred to as the rear side of the portable screen 10.

The two stops 23, 24 are lodged respectively in the two grooves 21, 22. Stop 23 is situated in groove 21 adjacent the rear side C3 of the screen carrier 10, while stop 24 is situated in groove 22 adjacent the front side C1 of the screen carrier 10.

Figure 4:
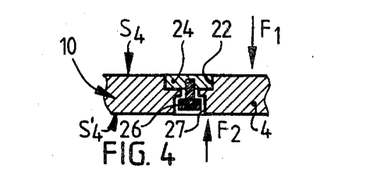
FIG. 4 is an enlarged partial cross-sectional view on the line IV—IV of FIG. 1.

Stop 23, in the form of a rectangular parallelopiped, has its extreme surface adjacent to front side C1 of screen carrier 10. This surface has a curve 25 which may be in the form of V. Stop 24, also in the form of a rectangular paralellopiped, has its extreme surface adjacent one side C1 of screen carrier 10 and this surface has a right section. Each stop 23, 24 is maintained in position by a screw 26 which traverses an opening 27 bored in the post in face F2 as best shown in FIG. 4. Bore 27 has an axis perpendicular to the axis of the associated groove.

Before describing the second part 20b of the positioning and holding device of the screen carrier at the level of the serigraphic machine, it is advantageous to first describe briefly the serigraphic machine. This will enable the second part 20b to be more easily located with respect to the machine and the invention to be more readily understood and appreciated.

Figure 5:
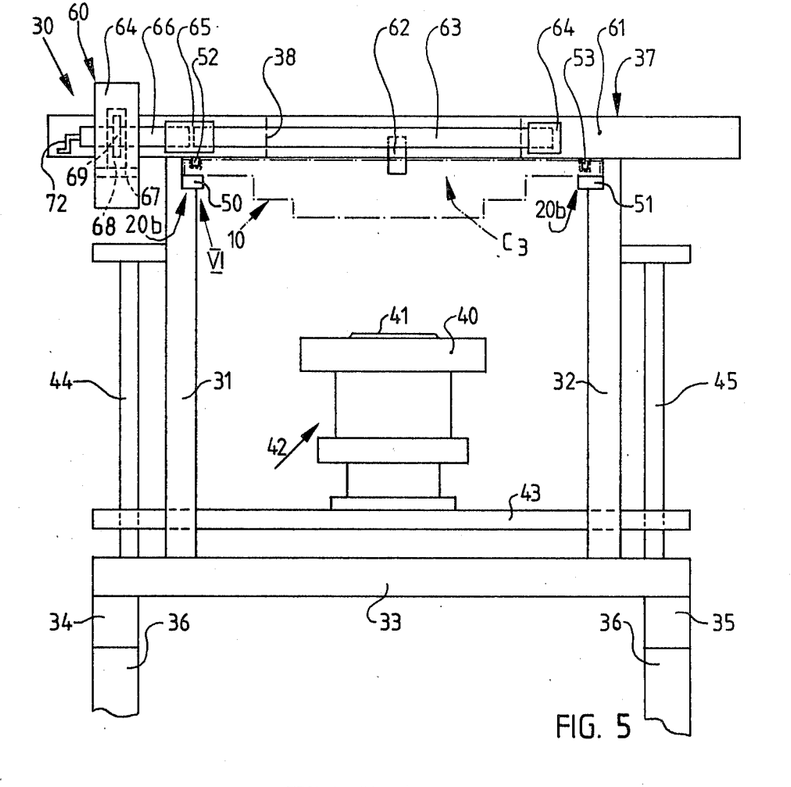
FIG. 5 is a schematic elevational view of a serigraphic machine to illustrate the part of the positioning and holding device for the screen carrier conforming to the invention situated at the level of this machine.

Referring to FIG. 5, the serigraphic machine 30 comprises a base formed of two lateral vertical plates 31, 32 fixed on a mount 33 which rests on two beams 34, 35 supported by feet 36. These two vertical plates 31, 32 are connected together at their upper end by a horizontal bearing plate 37 provided with a central opening 38 on which the serigraphic screen 10 can be placed as a cover, as shown in FIG. 5 by the dash lines which outline the position of the screen. A substrate 41 rests on a plate 40. Plate 40 is fixed on a positioning block 42, which is itself disposed on a horizontal plate 43 which can slide along a perpendicular direction the length of two vertical rods 44, 45 fixed to the base and extending respectively the length of the vertical plates 31, 32.

The part 20b of the positioning and holding device for a screen carrier conforming to the invention comprises at the level of the serigraphic machine 30, two horizontal slides 50, 51 with parallel axes extending parallel to the lateral plates 31, 32 of the base of the machine 30. Slides 50, 51 are supported respectively by the two plates 31, 32 and are mounted at the same level near the upper part of these plates and on the interior side of the base of the machine 30. Two reference pins 52, 53, with vertical axes, are connected to and depend from horizontal plate 37 of the base of the serigraphic machine 30. Each pin 52, 53 extend beneath the lower surface of the horizontal plate 37 such that the space between the two reference pins 52, 53 is identical to the space between centers of the grooves 21, 22 of an associated screen carrier 10. The two pins 52, 53 have a diameter essentially substantially less than the diameter of the grooves 21, 22 of the screen carrier 10.

Means for holding (60) the screen carrier 10 in position once it has been introduced into the serigraphic machine 30 are provided. However, before describing these blocking means 60 in great detail, the phase of mounting of screen carrier 10 in the serigraphic machine 30 such as seen in FIG. 5 will be described to provide a better understanding of the invention.

Screen carrier 10 is introduced by its front edge C1 into serigraphic machine 30, sliding it along slides 50, 51. The principal face F1 of screen carrier 10 becomes the upper face comprising the grooves 21, 22, while the principal face F2 of screen carrier 10 becomes the lower face on which has been mounted screen 12. The lower face F2 faces the substrate 41. During this movement, the reference pins 52, 53 of the base 37 of this serigraphic machine 30 are respectively aligned with the grooves 21, 22 of the screen carrier 10 and progressively penetrate to the interior of these grooves as the carrier is slid into the machine. This movement is interrupted as soon as the stops 23, 24 located respectively in grooves 21, 22 come respectively into contact with the reference pins 52, 53 of the serigraphic machine 30.

It is important to note the role played by the curve 25 which may in the form of V of the stop 23 in assuring the precise position of the screen carrier. This curve 25 permits a slight final pivoting of the screen carrier 10 in its plane when reference pin 52 comes in contact with the corresponding surface defined by the curve 25 of stop 23. This pivoting of screen carrier 10 occurs solely only when the axis of groove 21 is not strictly aligned with the axis of reference pin 52 during the phase of mounting of screen carrier 10. This is generally the case because of light lateral play which exists between the sides C2 and C4 of screen carrier 10 and the lateral plates 31, 32 of the base which define with the slides 50, 51 and the upper horizontal plate 57 of the base of the machine, an opening in which the screen carrier 10 is introduced. Said pivoting permits perfect centering of support screen 10 before stop 24 mounted in groove 22 of screen carrier 10 comes in contact with reference pin 53 of the base of the serigraphic machine 30 to immobilize the screen carrier 10.

It is easy to understand then that the screen carrier 10 is blocked toward the front, but not blocked toward the rear. To this end, blocking means 60 are provided to block the screen carrier 10 from the rear.

These blocking means 60 are supported by the surface of the extremity 61 of the horizontal plate of the base of the serigraphic machine 30. This extreme surface is adjacent to the rear side C3 of screen carrier 10. These means are thus situated at a level other than that occupied by the screen carrier 10 in the serigraphic machine 30. Actually, these means cannot be situated at the same level as that occupied by screen carrier 10, because of the manner of introduction of screen carrier 10 in the serigraphic machine 30.

Figure 6:
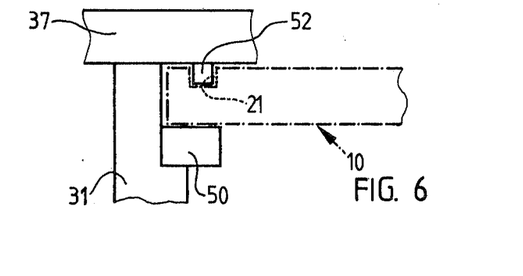
FIG. 6 is a view in enlarged detail indicated by arrow VI of FIG. 5.

Blocking means 60 include a latch 62 connected to a rod 63 movable in rotation under the control of a jack, for example. Rod 63 extends parallel to the rear side C3 of the screen carrier, with an extremity rotatively mounted in a bearing 64 carried by the surface of extremity 61 of horizontal plate 37, while its other extremity is mechanically coupled by an arrangement 65 to a second rod 66 aligned with rod 63. Latch 62 which extends perpendicularly to rod 63, is situated on this rod in such a way as to be able to come into contact after rotation with the rear side C3 of screen carrier 10, substantially toward the middle of this side C3. The rod 66 in leaving coupling device 65 is driven in rotation under the action of displacement of piston 67 of a jack 64 of which the body is carried by the surface of extremity 61 of plate 37 of the serigraphic machine 30. In accordance with an embodiment, the rod of jack 64 is perpendicular to the rod 66. The piston 67 of jack 64 supports a toothed rack 68 which engages a pinion 69 fixed to the free end of rod 66 which extends into the interior of the body of jack 64.

Thus, under the control of jack 64, latch 62 pivots to exert a pressure on the rear side C3 of screen carrier 10 to assure its remaining in position and maintaining a positive contact between the stops 23, 24 of screen carrier 10 and the reference pins 52, 53 carried by the base of serigraphic machine 30.

Blocking means 60 can further include jacks (not shown), with vertical axis supported by the upper horizontal plate 37 of the base of serigraphic machine 30 and arranged to apply a pressure on the upper face F1 of screen carrier 10 to force it against the slides 50, 51. In the example illustrated, rod 66 is extended by a crank lever 72 connected for rotation with rod 66 and which functions to actuate a contact which controls the pressurization of the jacks aforesaid so as to place latch 62 in contact position with side C3.

Then, once the substrate 41 is correctly positioned on the base 40, base 40 is raised to bring the substrate 41 to immediate proximity of screen 12 to carry out the operation of depositing a layer on this substrate 41, as is described in detail in the aforenoted patent application Ser. No. 331,283.

Before adjusting the position of the screen to carry out the deposition, it is necessary to mount and maintain the screen carrier on a plate or support associated with a means for adjusting the position of the screen. In French Pat. No. 2,182,298, the mounting of the screen carrier is carried out by placing it on a horizontal plate having two reference pins in the vertical axis, which engage respectively in two bores in the screen carrier. Once the screen carrier is thus maintained in position, the adjustment of the position of the screen with respect to the screen carrier can be carried out as described in this French patent.

However, in accordance with the present invention, the apparatus or device for positioning and holding the screen carrier conforming to the invention in a serigraphic machine, does not require the presence of bores in the screen carrier to assure its mounting and holding in the serigraphic machine. To be able to reconcile the positioning and holding device conforming to the invention and the adjustment apparatus described in French Pat. No. 2,182,298, there are two solutions:

In accordance with a first solution, the device for adjustment shown in French Pat. No. 2,182,298 can be adapted or equipped with a positioning and holding device which positions and holds in position the screen carrier to enable the adjustment of the position of the screen with respect to the screen carrier to be carried out before mounting the screen in the serigraphic machine.

In the second solution, the positioning and holding device of the invention is utilized for means for positioning and holding of the screen carrier as well as the adjusting device for the position of the screen described in French Pat. No. 2,182,298. This adaptation is primarily to make uniform the serigraphic apparatus utilized for the manufacture of multi-layer substrates.

Figure 7:
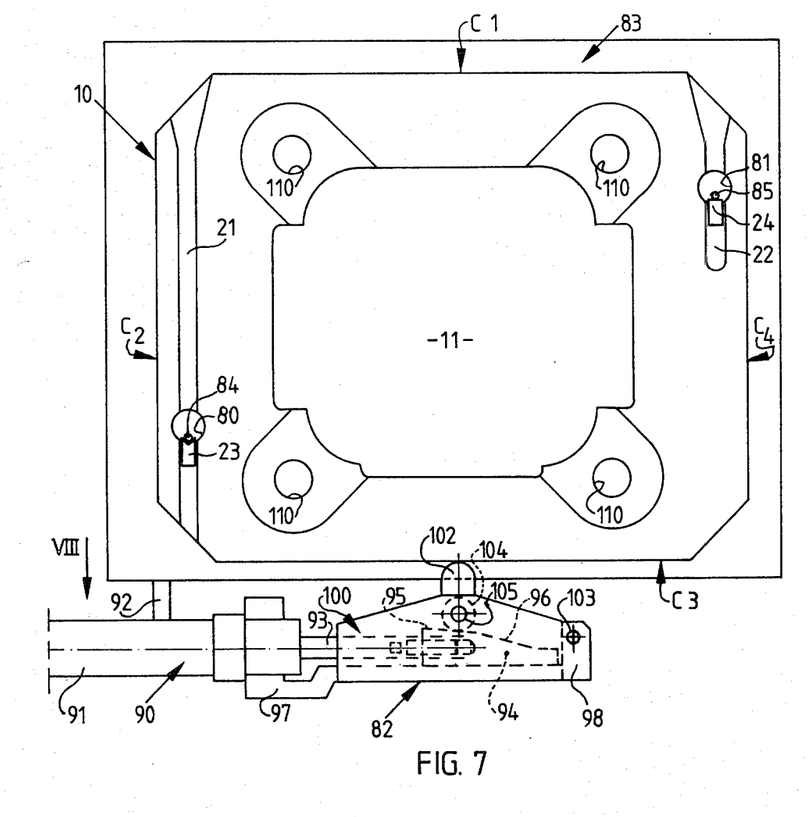
FIG. 7 is a schematic plane view of the mounting of the screen carrier on the base of regulating device for the position of the screen with respect to the screen carrier, before mounting in the serigraphic machine.
Figure 8:
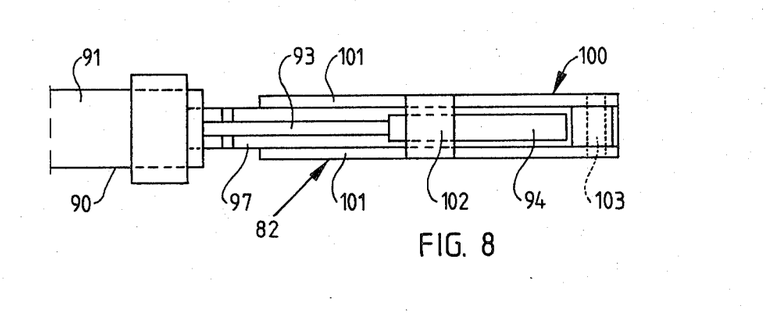
FIG. 8 is an enlarged view following the arrow VIII of FIG. 7.

The adaptation of the second solution is shown in FIGS. 7 and 8 where the positioning and holding device conforming to the invention is completed by two bores 80 passing through screen carrier 10, centered respectively on the axes of the two grooves 21, 22 and situated in these grooves in such a way that the extremities of the stops 23, 24 adjacent to the front side C1 of screen carrier 10 extend respectively in these two bores 80, 81. Holding means 82 are provided to hold the screen carrier 10 in position on the plate or support 83 of the adjusting device used for positioning of the screen with respect to the screen carrier, such as described in French Pat. No. 2,182,298.

Before describing the holding device 82, it is advantageous to first describe mounting of the screen carrier 10 on plate 83 of the adjusting device for the screen with respect to the screen carrier with reference to FIG. 7.

Horizontal plate 83 has two reference pins 84, 85 having vertical axes. The spacing of these two reference pins is equal to the spacing of the two grooves 21, 22 of screen carrier 10. The screen carrier is mounted on plate 83 in such a way as to cause the reference pins 84 and 85 to directly penetrate in the two orifices 80 and 81, respectively. It is important to note that the diameters of the bores 80, 81 are substantially greater than the diameters of reference pins 84, 85 to avoid the inconveniences described in the preamble of the invention. This mounting is for the moment identical to that described in French Pat. No. 2,182,298. However, the screen carrier 10 is not maintained in position by reason of the difference of diameter between the orifices 80 and 81 of screen carrier 10 and the diameters of reference pins 84, 85 carried by plate 83. The object of holding means 82 is to assure and maintain contact between the reference pins 84 and 85 with the adjacent surface of the stops 23 and 24, respectively.

The holding means 82 are mounted on the outside of plate 83, substantially in the plane of screen carrier 10 and situated at the rear edge C3 of the screen carrier 10 to cooperate with this rear edge to exert a movement of translation on the screen carrier 10 to bring the stops 23 and 24 in contact with reference pins 84 and 85 respectively. The holding means 82 (FIGS. 7 and 8) are essentially constituted by a driving member such as a jack 90 which controls a pivoting lever 100 arranged to come into contact with the rear side C3 of screen carrier 10. Jack 90 is mounted parallel to the rear side C3 of screen carrier 10. The body 91 of the jack is, for example, supported by plate 83 through a rigid connection referenced at 92. Piston rod 93 of jack 90 is extended having a free end carrying a cam 94 in the form of a rectangular parallelopiped. The side of cam 94 adjacent to side C3 of screen carrier 10 has a cam path in the form of two inclined planes 95, 96. The opposite side of cam 94 slides on a support 97 supported at an extremity by the body 91 of jack 90, and of which the outward extremity ends in a shoulder 98 which extends perpendicularly to the piston rod 93 in direction of the rear edge C3 of screen carrier 10.

Lever 100 has the form of a piece composed of two longitudinal lateral walls 101 which are interconnected parallel to each other, toward their middle, by an element 102 which extends along these lateral walls 101 in a direction perpendicular to the longitudinal axis of these walls. The extreme free surface of element 102 is rounded and forms the active part of lever 100 designed to cooperate with the rear side C3 of screen carrier 10.

Lever 100 is mounted on either side of cam 94 the body of jack 91 and shoulder 98 of support 97, in such a way that the lateral plates 101 of lever 100 are situated in the horizontal plane, as shown in FIG. 8, with the element 102 facing the rear edge C3 of screen carrier 10.

Lever 100 is articulated around a vertical axis 103 supported by shoulder 98 having an orifice.

Cam 94 is situated consequently between the lateral walls 101 of lever 100 and cooperates with a roller 104 rotatably mounted around a vertical axis 105 supported by the two lateral walls 101 of lever 100. More precisely, roller 104 is situated in a horizontal plane, is designed to roll on the cam path 95, 96 of cam 94. In other words, the roller is mounted between the cam 94 and element 102 connecting the lateral plates 101 of lever 100.

Inclined plane 95, adjacent body 91 of jack 90 has a less abrupt slope than the inclined plane 96 adjacent to shoulder 98 of support 97 connected to body 91 of jack 90. In the position shown in FIG. 7, element 102 of lever 100 is in contact with the rear edge C3 of screen carrier 10 and exerts a pressure against this side C3 to assure contact between stops 23 and 24 of screen carrier 10 and reference pins 84, 85 of plate 83, jack 90 then being under pressure.

In the initial position, piston rod 93 is in a withdrawn position so that roller 104 is located then on incline plate 96 of cam 94, thus avoiding pressure on side C3. In accordance with the extension of piston rod 93, roller 104 passes progressively from inclined plane 96 to inclined plane 95 causing pivoting of lever 100 around its articulation axis 103 in the direction of side C3 of screen carrier 10, cam 94 sliding on fixed support 97.

With reference to FIG. 2, and without departing from the concept of the invention, groove 21 can be situated at the edge of face F1 of screen carrier 10 and groove 22 situated at the edge of face F2 of screen carrier 10, and reversely.

It is equally obvious that the two posts 2 and 4 need not be absolutely in a same plane so long as they remain parallel.

Referring to FIG. 1, the four openings 110 which traverse the screen carrier 10 serve in the mounting of the screen 12 on screen carrier 10, regulatable fixing means entering these orifices.

Also without departing from the spirit of the invention, such a positioning and holding device can be applied to serigraphic machines for the manufacture of other products and connection circuit supports with thick layers.

I claim:

1. Apparatus for positioning and holding (20a, 20b) a screen carrier inserted in a serigraphic machine wherein the screen carrier (10) is a frame having two principal opposed faces (F1, F2) and includes four posts (1,2,3,4) defining four sides and a central opening (11) in the frame, two of the posts (2,4,) being parallel to each other, and having two opposed plane surfaces (S2, S4) situated respectively in the two principal faces of the screen carrier (10); a screen (12) adapted to be carried on one of the faces (F2) of the screen carrier (10) so as to cover its opening (11); comprising two grooves (21, 22) respectively extending parallel in two of said plane surfaces (S2, S4) of the two parallel posts (2, 4) of the screen carrier (10) and having at least an extremity opening to the exterior of the same side (C1) of the screen carrier (10), two stops (23, 24) mounted respectively in the two grooves (21, 22) for presenting toward said same side a straight surface and a curved surface respectively while standing apart from said same side different lengths, two horizontal parallel slides (50, 51) carried by a base of the serigraphic machine which cooperate respectively with two plane opposed surfaces (S'2, S'4) of the parallel posts (2, 4) of screen carrier (10) for slidingly supporting the screen carrier (10) in the serigraphic machine (30), two fixed vertical reference pins (52, 53) connected to the base of the machine, and aligned respectively with the two grooves (21, 22), said grooves being so dimensioned as to engage progressively said reference pins and to have a width substantially greater than the diameter of the repective reference pins up to said stops, and means (60) for maintaining and holding the screen carrier (10) in position once the reference pins (52, 53) are in contact with the associates tops (23, 24) of the screen carrier (10).

2. Apparatus according to claim 1 wherein said curve is essentially a V shape.

3. Apparatus in accordance with claim 2 wherein the axle (63) supports at an extremity a pinion (69) mounted within the interior of a jack (64) to engage therein a rack (68) connected with a piston (67) of the jack (64), said piston being disposed for movement in a direction perpendicular to the axle (63) supporting latch (62).

4. Apparatus in accordance with claim 3 including means for assuring the adjustment of the position of the pattern of the screen with respect to the screen carrier before mounting in the serigraphic machine, said means comprising two bores (80, 81) passing through the screen carrier (10), said bores being located respectively on the axes of said two grooves (21, 22) and with respect to the two stops (23, 24) lodged respectively in the two grooves (21, 22) such that the surface of extremity of the two stops (23, 24) adjacent to said same side (C1) of the screen carrier extend respectively in said two bores (80, 81), two reference pins (84, 85) having vertical axis, carried by a support (83) for adjusting position of the screen with respect to the screen carrier, said reference pins adapted to be positioned in said bores, the diameter of the openings of the bores (80, 81) being greater than the diameter of reference pins (84, 85); and holding means (82) for holding the screen carrier (10) against the reference pins (84, 85) including an articulated lever (100) situated in the plane of the screen carrier and connected to a control jack (90) operable to cause the screen carrier (10) to be held against the reference pins.

5. Apparatus in accordance with claim 4 wherein the lever (100) supports a rotatable and rectilinearly movable roller (104), a cam (94) having a cam surface (95, 96), said roller being held in contact with the cam surface (95, 96) and movable there along, said cam being connected to a free extremity of a piston rod (93) of the control jack (90), and said lever (100) being articulated around a fixed axis (103) so as to pivot around this axis (103) in a direction toward the screen carrier (10) as the roller (104) is moved in one direction on the cam surface (95, 96) and in a direction away from the screen carrier as the roller moves in an opposite direction, said movement being controlled in response to the position of the piston rod.

6. Apparatus in accordance with claim 1 wherein said means (60) for maintaining and holding the screen carrier (10) in position comprises a latch (62) perpendicularly connected to an axle (63) near and parallel to the opposite side of said same side of the screen carrier and rotatingly perpendicular to said principal faces.

7. Apparatus in accordance with claim 1 wherein the two grooves (21, 22) are at the level of one and the same principal face (F1) of the screen carrier, said principal face of the screen carrier (10) being opposite to that face receiving the screen (12).

8. Apparatus in accordance with claim 5 including means for assuring the adjustment of the position of the pattern of the screen with respect to the screen carrier before mounting in the serigraphic machine, said means comprising two bores (80, 81) passing through the screen carrier (10), said bores being located respectively on the axes of said two grooves (21, 22) and with respect to the two stops (23, 24) lodged respectively in the two grooves (21, 22) such that the surface of extremity of the two stops (23, 24) adjacent to said same side (C1) of the screen carrier extend respectively in said two bores (80, 81), two reference pins (84, 85) having vertical axis, carried by a support (83) for ajusting position of the screen with respect to the screen carrier, said reference pins adapted to be positioned in said bores, the diameter of the openings of the bores (80, 81) being greater than the diameter of reference pins (84, 85); and holding means (82) for holding the screen carrier (10) against the reference pins (84, 85) including an articulated lever (100) situated in the plane of the screen carrier and connected to a control jack (90) operable to cause the screen carrier (10) to be held against the reference pins.

9. Apparatus in accordance with claim 8, wherein the lever (100) supports a rotatable and rectilinearly movable roller (104), a cam (94) having a cam surface (95, 96), said roller being held in contact with the cam surface (95, 96) and movable there along, said cam being connected to a free extremity of a piston rod (93) of the control jack (90), and said lever (100) being articulated around a fixed axis (103) so as to pivot around this axis (103) in a direction toward the screen carrier (10) as the roller (104) is moved in one direction on the cam surface (95, 96) and in a direction away from the screen carrier as the roller moves in an opposite direction, said movement being controlled in response to the position of the piston rod.

* * * * *

UNITED STATES PATENT AND TRADEMARK OFFICE
CERTIFICATE OF CORRECTION

PATENT NO. : 4,473,007

DATED : September 25, 1984

INVENTOR(S) : Robert C. Colineau

It is certified that error appears in the above-identified patent and that said Letters Patent is hereby corrected as shown below:

In Claim 6, line 43, after "rotatingly" insert -- movable --.

Signed and Sealed this

Nineteenth Day of March 1985

[SEAL]

Attest:

DONALD J. QUIGG

Attesting Officer    Acting Commissioner of Patents and Trademarks